(12) United States Patent
Jou et al.

(10) Patent No.: US 6,440,845 B1
(45) Date of Patent: Aug. 27, 2002

(54) METHOD OF FABRICATING INTERCONNECT OF CAPACITOR

(75) Inventors: Chewnpu Jou, Hsinchu Hsien; Roger Yen, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 14 days.

(21) Appl. No.: 09/684,591

(22) Filed: Oct. 5, 2000

(51) Int. Cl.[7] .................... H01L 21/4763; H01L 21/20; H01L 21/31; H01L 21/469

(52) U.S. Cl. .................. 438/637; 438/386; 438/393; 438/396; 438/782

(58) Field of Search ................. 438/637, 381, 438/386, 393, 396, 778, 782

(56) References Cited

U.S. PATENT DOCUMENTS 6,140,672 A * 10/2000 Arita et al. ............... 257/295
6,168,985 B1 * 1/2001 Asano et al. .............. 438/241
6,180,453 B1 * 1/2001 Sung et al. ................ 438/256
6,284,586 B1 * 9/2001 Seliskar et al. ............ 438/239
6,313,003 B1 * 11/2001 Chen ......................... 438/148

OTHER PUBLICATIONS

Lee et al., Application of HSQ (Hydrogen Silsesquioxane) Based SOG to Pre-Metal Dielectric Planarization in STC (Stacked Capacitor) DRAM, 1996, IEEE Symposium on VLSI Technology Digest of Technical Papers, pp 112–113.*

* cited by examiner

Primary Examiner—Richard Elms
Assistant Examiner—Adam Pyonin
(74) Attorney, Agent, or Firm—J.C. Patents

(57) ABSTRACT

A method of fabricating an interconnect of a capacitor. A substrate having a capacitor is provided. The capacitor comprises a bottom electrode electrically connected to the substrate, a dielectric layer and a top electrode thereon. A spin-on dielectric layer is formed on the substrate and the capacitor. The spin-on dielectric layer on the substrate is thicker than that on the top electrode. The spin-on dielectric layer is etched back until the top electrode is exposed. A patterned metal layer is formed on the spin-on dielectric layer and the top electrode with a bottom surface in directly contact with a top surface of the top electrode.

14 Claims, 2 Drawing Sheets

METHOD OF FABRICATING INTERCONNECT OF CAPACITOR

BACKGROUND OF THE INVENTION

1. Field of the Invention

The invention relates in general to a method of fabricating an integrated circuit. More particularly, this invention relates to a method of fabricating an interconnection structure of a capacitor.

2. Description of the Related Art

The capacitor and inductor are the major devices in the oscillation circuit of a radio frequency (RF) device. A capacitor in the oscillation circuit is typically in a metal-insulator-metal (MIM) stack structure. That is, the capacitor includes a bottom metal electrode plate, an inter-metal dielectric layer (IMD) and a top metal electrode plate. The bottom metal electrode plate is electrically connected to the substrate, and the top metal electrode plate is electrically connected to another metal layer. The method for fabricating a such conventional capacitor is described as follows.

In FIG. 1A, a substrate 100 having a capacitor 110 that has been formed thereon is provided. The capacitor 110 comprises a bottom metal electrode plate 112, an inter-metal dielectric layer 114 on the bottom metal electrode plate 112 and a top metal electrode plate 116 on the inter-metal dielectric layer 114. A dielectric layer 130 is formed to cover the substrate 100 and the top metal electrode plate 116.

In FIG. 1B, via holes 140 are formed within the dielectric layer 130 to expose a portion of the top metal electrode plate 116. The via holes 114 are then filled with metal material to form plugs 150, which completes the interconnect of the capacitor.

Using the conventional method described above, the quality factor (the Q-value) of the capacitor 110 is degraded. The reason is explained as follows. The Q value is equal to a ratio of the electric energy stored in the electrode plate to the energy consumption. The energy consumption is a sum of the energy consumed in the metal bottom electrode plate 112, the metal top electrode plate 116, the plugs 150 and the metal layer 160. Because the cross section of the plug is small, the resistance is great which increases energy consumption. In addition, a skin effect is caused during a high frequency operation, that is, a majority of current is converged on a portion of the surface of the plugs 150. The resistance of the capacitor is increased which results in higher energy consumption. Consequently, the Q value is decreased.

SUMMARY OF THE INVENTION

The invention provides a method of fabricating an interconnect of a capacitor. A substrate comprising a capacitor thereon is provided. The capacitor comprises a metal bottom electrode plate electrically connected to the substrate, an inter-metal dielectric layer on the metal bottom electrode plate and a metal top electrode plate on the inter-metal dielectric layer. A spin-on dielectric layer is formed to cover the metal top electrode plate of the capacitor and the substrate with a portion on the metal top electrode plate thicker than a portion on the substrate. The spin-on dielectric layer is etched back to expose a surface of the metal top electrode plate. A metal layer is formed on the spin-on dielectric layer and the metal top electrode plate to have a direct contact with the surface of the metal top electrode plate. The metal layer is then patterned to form an interconnect of the capacitor.

In the above method, if an inductor is formed on the substrate together with the capacitor, a surface of the inductor is also exposed after etching back the spin-on dielectric layer. The metal layer is thus formed in contact with not only the surface of the metal top electrode plate of the capacitor, but also the surface of the inductor. After being patterned, an interconnect of the inductor is also formed.

An interconnect of a capacitor is further provided by the invention. The interconnect comprises a metal layer formed on a dielectric layer and in contact with a metal top electrode plate of a capacitor. In addition to the top electrode plate, the capacitor further comprises a metal bottom electrode plate on a substrate and an inter-metal dielectric layer on the metal bottom electrode plate.

Thus formed, the interconnect of the capacitor is in direct contact with the metal top electrode plate, so that the resistance of the interconnect and the contact resistance between the interconnect and the capacitor is decreased to reduce the energy consumption. The Q factor can thus be enhanced effectively. In addition, when an inductor is formed on the same substrate on which the capacitor is formed, a direct contact between the interconnect and the inductor is also established to minimize the resistance, so that the Q factor of the inductor is also enhanced.

Both the foregoing general description and the following detailed description are exemplary and explanatory only and are not restrictive of the invention, as claimed.

DESCRIPTION OF THE PREFERRED EMBODIMENTS

Figure 2A:
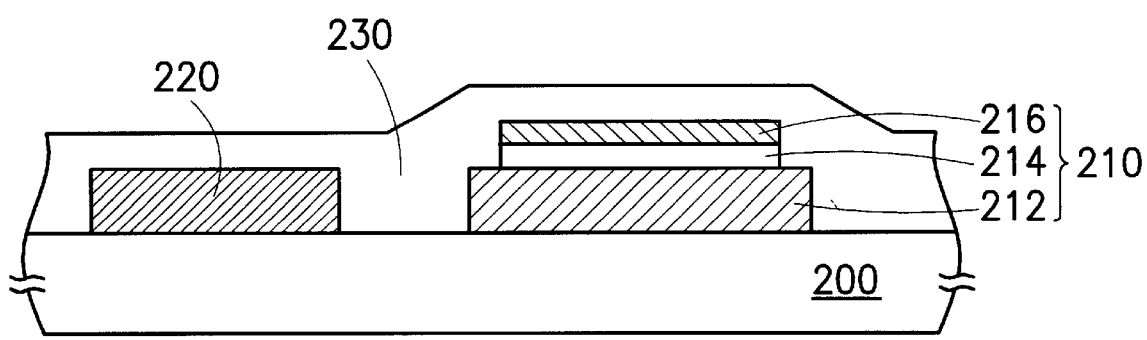
FIG. 2A to FIG. 2D show a method of fabricating an interconnect of a capacitor and an inductor according to the invention.

In FIG. 2A, a substrate 200 is provided. The substrate 200 comprises a capacitor 210 and an inductor 220 formed thereon. The capacitor 210 comprises a metal bottom electrode plate 212 on the substrate 200, an inter-metal dielectric layer 214 on the metal bottom electrode plate 212 and a metal top electrode plate 216 on the inter-metal dielectric layer 214. The metal bottom electrode plate 212 is electrically connected to the substrate 200, and the material of the metal bottom electrode layer 212 includes, for example, aluminum with a thickness of about 6000–8000 angstroms. The inter-metal dielectric layer 214 has a thickness of about 400–600 angstroms. The material of the metal top electrode plate 216 includes, for example, aluminum with a thickness of about 500–1000 angstroms. The inductor 220 is also electrically connected to the substrate 200. Often the inductor 220 has a coil shape on the substrate 200. The cross section of inductor 220 as illustrated in FIG. 2A is only a portion of the inductor.

A spin-on dielectric layer 230 is formed on the metal top electrode plate 216, the substrate 200 and the inductor 220. As shown in FIG. 2A, the thickness of the spin-on dielectric layer 230 on the inductor 220 and the metal top electrode plate 216 is thinner than that on the substrate 200. The material of the spin-on dielectric layer 230 includes, for example, hydrogen silesquioxane (HSQ). The thickness of the spin-on dielectric layer 230 on the substrate 200 is about 7000–9000 angstroms.

Figure 2B:
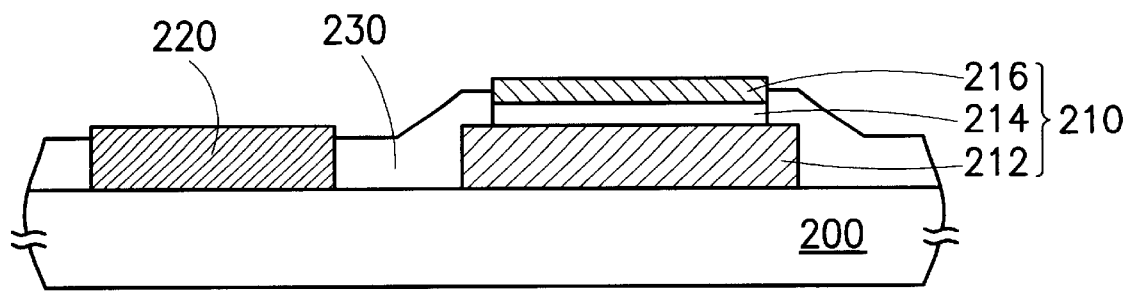

In FIG. 2B, the spin-dielectric layer 230 is etched back to expose top surfaces of the inductor 220 and the metal top electrode plate 216.

Figure 2C:
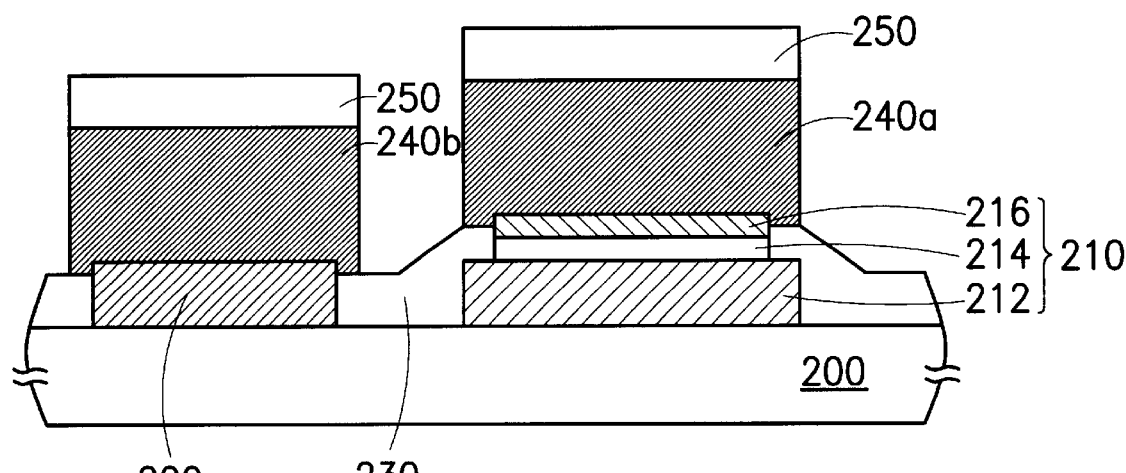

In FIG. 2C, a metal layer is formed on the remaining spin-on dielectric layer 230 and the inductor 220 and the metal top electrode plate 216. Forming a patterned photoresist layer 250 on the metal layer, the metal layer is patterned to form interconnects 240a on the capacitor 210 and 240b on the inductor 220. As shown in FIG. 2C, the interconnect 240a is in contact with the top surface of the metal top electrode plate 216 of the capacitor 210, while the interconnect 240b is in contact with the top surface of the inductor 220.

Figure 2D:
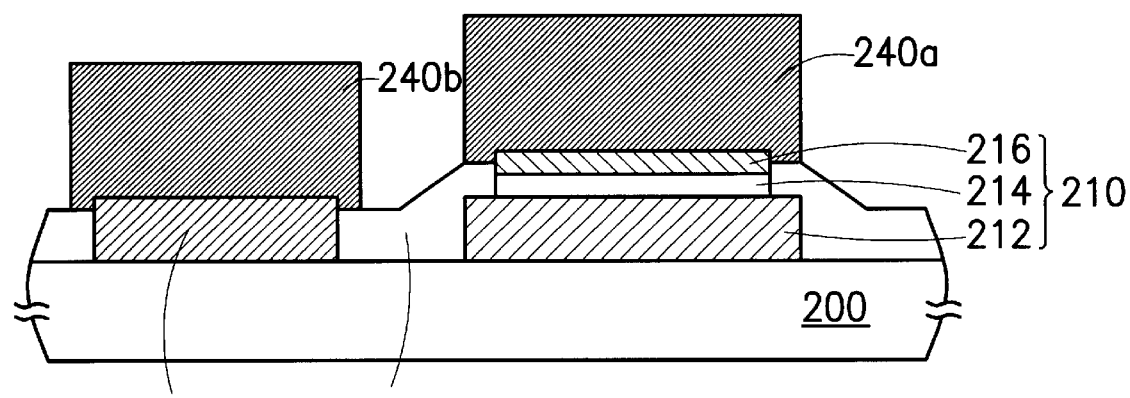

In FIG. 2D, the photoresist layer 250 is removed, and the interconnects 240a and 240b of the capacitor 210 and the inductor 220, respectively, are formed as shown.

Figure 1A:
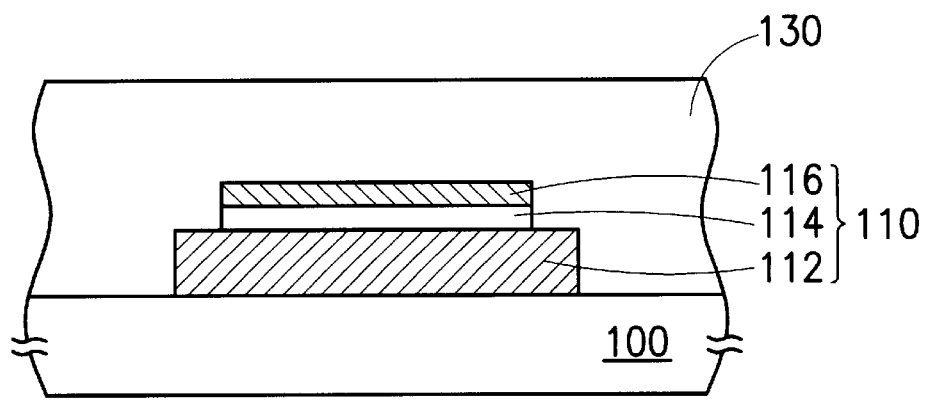
FIG. 1A to FIG. 1B show a conventional method of fabricating an interconnect of a capacitor.
Figure 1B:
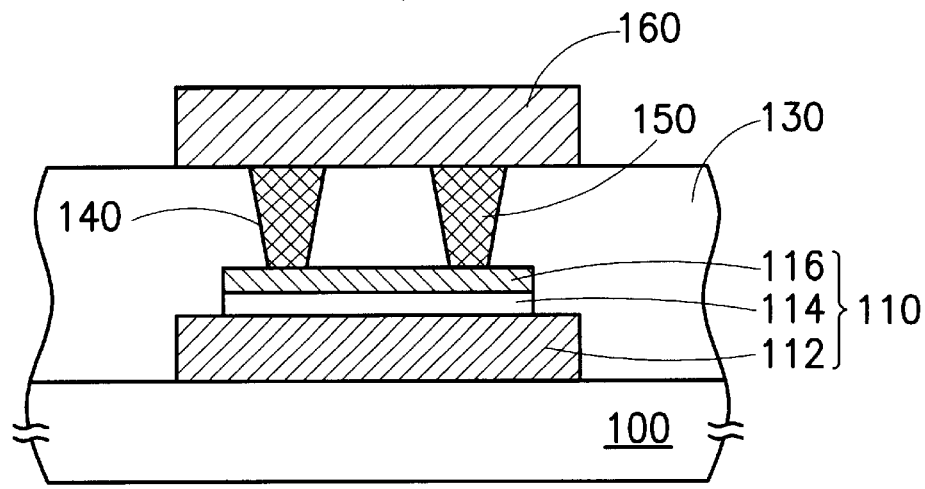

As mentioned above, referring to FIG. 2D, the interconnect 240a is in direct contact with the metal top electrode plate 216, so that the resistance is much smaller than that of the plugs formed in the conventional method. Similarly, the resistance between the interconnect 240a and the inductor 220 is also much smaller. The energy consumption is thus effectively reduced to enhance the Q factor of the capacitor 210 and the inductor 220. Therefore, even if skin effect occurs, as the cross sections of the interconnects 240a and 240b are much larger than that of the plugs 150 (FIG. 1B), the energy consumption is significantly smaller.

It will be apparent to those skilled in the art that various modifications and variations can be made to the structure of the present invention without departing from scope or spirit of the invention. In view of the foregoing, it is intended that the present invention cover modifications and variations of this invention provided they fall within the scope of the following claims and their equivalents.

What is claimed is:

1. A method of fabricating an interconnect of a capacitor, comprising:
   providing a substrate having a capacitor that includes a metal bottom electrode plate electrically connected to the substrate, an inter-metal dielectric layer on the metal bottom electrode plate and a metal top electrode plate on the inter-metal dielectric layer;
   forming a spin-on dielectric layer on the substrate and the capacitor;
   etching back the spin-on dielectric layer until an entire top surface of the metal top electrode plate is exposed; and a
   forming a patterned metal layer in contact with the entire top surface of the metal top electrode plate.

2. The method according to claim 1, wherein step of forming the spin-on dielectric layer comprises forming a hydrogen silequioxane layer.

3. The method according to claim 1, wherein the step of providing the substrate comprises providing a metal top electrode plate with a thickness of about 6000–8000 angstroms.

4. The method according to claim 1, wherein the step of providing the substrate comprises providing an inter-metal dielectric layer with a thickness of about 400–600 angstroms.

5. The method according to claim 1, wherein the step of providing the substrate comprises providing the metal top electrode plate with a thickness of about 500–1000 angstroms.

6. The method according to claim 1, wherein the step of forming a spin-on dielectric layer comprises forming the spin-on dielectric layer with a thickness of about 7000–9000 angstroms.

7. The method according to claim 1, wherein the step of forming a metal layer comprises forming the metal layer with a thickness of about 16000–20000 angstroms.

8. A method of fabricating an interconnect of a capacitor and an inductor, comprising:
   providing a substrate having a capacitor and an inductor thereon, wherein the capacitor comprises a metal bottom electrode plate electrically connected to the substrate, an inter-metal dielectric layer on the metal bottom electrode plate and a metal top electrode plate on the inter-metal dielectric layer, and the inductor is electrically connected to the substrate;
   forming a spin-on dielectric layer covering the substrate, the inductor and the capacitor, wherein the spin-on dielectric layer covering the inductor and the capacitor is thinner than the spin-on dielectric layer covering the substrate;
   etching back the spin-on dielectric layer until top surface of the inductor and the capacitor are exposed; and
   forming a first patterned metal layer on the top surface of the capacitor and a second patterned metal layer on the entire top surface of the inductor, so that the first patterned metal layer is in direct contact with the top metal electrode plate of the capacitor and the second patterned metal layer is in direct contact with the inductor.

9. The method according to claim 8, wherein step of forming the spin-on dielectric layer comprises forming a hydrogen silequioxane layer.

10. The method according to claim 8, wherein the step of providing the substrate comprises providing a metal top electrode plate with a thickness of about 6000–8000 angstroms.

11. The method according to claim 8, wherein the step of providing the substrate comprises providing an inter-metal dielectric layer with a thickness of about 400–600 angstroms.

12. The method according to claim 8, wherein the step of providing the substrate comprises provides the metal top electrode plate with a thickness of about 500–1000 angstroms.

13. The method according to claim 8, wherein the step of forming a spin-on dielectric layer comprises forming the spin-on dielectric layer with a thickness of about 7000–9000 angstroms.

14. The method according to claim 8, wherein the step of forming a metal layer comprises a forming the metal layer with a thickness of about 16000–20000 angstroms.

* * * * *